United States Patent
Chiang

(10) Patent No.: US 10,311,962 B2
(45) Date of Patent: Jun. 4, 2019

(54) DIFFERENTIAL SAMPLING CIRCUIT

(71) Applicant: MEDIATEK INC., Hsin-Chu (TW)

(72) Inventor: Tai-Yi Chiang, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/691,809

(22) Filed: Aug. 31, 2017

(65) Prior Publication Data
US 2018/0240530 A1    Aug. 23, 2018

Related U.S. Application Data

(60) Provisional application No. 62/462,405, filed on Feb. 23, 2017.

(51) Int. Cl.
G11C 27/02    (2006.01)

(52) U.S. Cl.
CPC .................. *G11C 27/024* (2013.01)

(58) Field of Classification Search
CPC ...... G11C 27/026; G11C 27/02; G11C 27/024
USPC ............................................. 327/94, 95, 96
See application file for complete search history.

(56) References Cited

U.S. PATENT DOCUMENTS

| | | | |
|---|---|---|---|
| 6,249,240 B1 | 6/2001 | Bellaouar | |
| 6,617,992 B2 | 9/2003 | Sakurai | |
| 6,744,394 B2 * | 6/2004 | Liu | H03M 3/34 341/144 |
| 7,009,549 B1 | 3/2006 | Corsi | |
| 2015/0280696 A1 * | 10/2015 | Bernacchia | H03K 5/007 327/307 |

FOREIGN PATENT DOCUMENTS

WO    2012151491 A2    11/2012

OTHER PUBLICATIONS

Liu, et al.: "A 10-bit 50-MS/s SAR ADC With a Monotonic Capacitor Switching Procedure"; IEEE Journal of Solid-State Circuits, vol. 45, No. 4, Apr. 2010; pp. 731-740.
TIPO Office Action dated Dec. 6, 2018 in Taiwan application (No. 106136816).

* cited by examiner

*Primary Examiner* — John W Poos
(74) *Attorney, Agent, or Firm* — McClure, Qualey & Rodack, LLP

(57) ABSTRACT

A differential sampling circuit includes: a first switching element having a first terminal receiving a first signal of a differential signal pair, a second switching element having a first terminal receiving a second signal of the differential signal pair, a first sampling capacitor connected between two second terminals of the first and the second switching elements, a third switching element connected between the second terminal of the second switching element and a reference voltage, a fourth switching element having a first terminal receiving the second signal, a fifth switching element having a first terminal receiving the first signal, a second sampling capacitor connected between two second terminals of the fourth and the fifth switching elements, and a sixth switching element connected between the second terminal of the fifth switching element and the reference voltage.

10 Claims, 5 Drawing Sheets

DIFFERENTIAL SAMPLING CIRCUIT

This application claims the benefit of U.S. provisional application Ser. No. 62/462,405, filed Feb. 23, 2017, the disclosure of which is incorporated by reference herein in its entirety.

FIELD OF THE INVENTION

The present invention relates to a sampling circuit, and more particularly to a differential sampling circuit.

BACKGROUND OF THE INVENTION

As known, sampling circuits are applied to many circuitry systems. FIG. 1 schematically illustrates a conventional analog-to-digital conversion system. As shown in FIG. 1, the analog-to-digital conversion system 100 comprises a buffering circuit 110 and an analog-to-digital converter (ADC) 120.

The buffering circuit 110 is a differential buffering circuit. Moreover, the buffering circuit 110 generates a differential signal pair (vip, vin) to two input terminals of the analog-to-digital converter 120. The signals vip and vin of the differential signal pair are complementary analog signals. The amplitudes of the signals vip and vin are equal. Moreover, the signals vip and vin have different signs. For example, in case that the first signal vip is +1, the second signal vin is −1.

The analog-to-digital converter 120 comprises a differential sampling circuit 122. The differential sampling circuit 122 comprises switching elements sw1, sw2 and sampling capacitors Ca1, Cb1. The capacitance values of the sampling capacitors Ca1 and Cb1 are equal.

A first terminal of the switching element sw1 is connected with a first input terminal of the analog-to-digital converter 120 so as to receive the first signal vip of the differential signal pair. The sampling capacitor Ca1 is connected between a second terminal of the switching element sw1 and a ground terminal. A first terminal of the switching element sw2 is connected with a second input terminal of the analog-to-digital converter 120 so as to receive the second signal vin of the differential signal pair. The sampling capacitor Cb1 is connected between a second terminal of the switching element sw2 and the ground terminal.

FIG. 2A schematically illustrates the operations of the differential sampling circuit of FIG. 1 during a sampling cycle. FIG. 2B schematically illustrates the operations of the differential sampling circuit of FIG. 1 during a holding cycle. The sampling cycle and the holding cycle are alternate cycles.

During the sampling cycle, the switching elements sw1 and sw2 are in a close state. Meanwhile, the two input terminals of the analog-to-digital converter 120 are connected with the sampling capacitors Ca1 and Cb1, respectively. Consequently, the voltage +v1 of the first signal vp1 and the voltage −v1 of the second signal vin are stored in the sampling capacitors Ca1 and Cb1, respectively.

During the holding cycle, the switching elements sw1 and sw2 are in an open state. Meanwhile, the two input terminals of the analog-to-digital converter 120 are disconnected from the sampling capacitors Ca1 and Cb1. Meanwhile, the voltages +v1 and −v1 are still stored in the sampling capacitors Ca1 and Cb1, respectively. According to the stored voltages of the sampling capacitors Ca1 and Cb1, a processing circuit of the analog-to-digital converter 120 acquires a difference voltage Δv between the voltages +v1 and −v1. The difference voltage Δv is 2v1, i.e., v1−(−v1) =2v1.

According to the difference voltage Δv, the processing circuit calculates a digital code. The digital code is used as an output digital code of the analog-to-digital converter 120.

SUMMARY OF THE INVENTION

An embodiment of the present invention provides a differential sampling circuit. The differential sampling circuit includes a first switching element, a second switching element, a third switching element, a first sampling capacitor, a fourth switching element, a fifth switching element, a sixth switching element and a second sampling capacitor. A first terminal of the first switching element receives a first signal of a differential signal pair. A first terminal of the second switching element receives a second signal of the differential signal pair. A first terminal of the third switching element is connected with a second terminal of the second switching element. A second terminal of the third switching element is connected with a reference voltage terminal. A first terminal of the first sampling capacitor is connected with a second terminal of the first switching element. A second terminal of the first sampling capacitor is connected with the second terminal of the second switching element. A first terminal of the fourth switching element receives the second signal of the differential signal pair. A first terminal of the fifth switching element receives the first signal of the differential signal pair. A first terminal of the sixth switching element is connected with a second terminal of the fifth switching element. A second terminal of the sixth switching element is connected with the reference voltage terminal. A first terminal of the second sampling capacitor is connected with a second terminal of the fourth switching element. A second terminal of the second sampling capacitor is connected with the second terminal of the fifth switching element.

Another embodiment of the present invention provides a differential sampling circuit. The differential sampling circuit includes a first switching element, a second switching element, a third switching element, a first sampling capacitor, a second sampling capacitor, a fourth switching element, a fifth switching element, a sixth switching element, a third sampling capacitor and a fourth sampling capacitor. A first terminal of the first switching element receives a first signal of a differential signal pair. A first terminal of the second switching element receives a second signal of the differential signal pair. A first terminal of the third switching element is connected with a second terminal of the second switching element. A second terminal of the third switching element is connected with a reference voltage terminal. A first terminal of the first sampling capacitor is connected with a second terminal of the first switching element. A second terminal of the first sampling capacitor is connected with the second terminal of the second switching element. A first terminal of the second sampling capacitor is connected with the second terminal of the first switching element. A second terminal of the second sampling capacitor is connected with the reference voltage terminal. A first terminal of the fourth switching element receives the second signal of the differential signal pair. A first terminal of the fifth switching element receives the first signal of the differential signal pair. A first terminal of the sixth switching element is connected with a second terminal of the fifth switching element. A second terminal of the sixth switching element is connected with the reference voltage terminal. A first terminal of the third sampling capacitor is connected with a second terminal of the fourth switching element. A second terminal of the third sampling capacitor is connected with the second terminal of the fifth switching element. A first terminal of the fourth sampling capacitor is connected with a second terminal of the fourth switching element. A second terminal of the fourth sampling capacitor is connected with the reference voltage terminal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
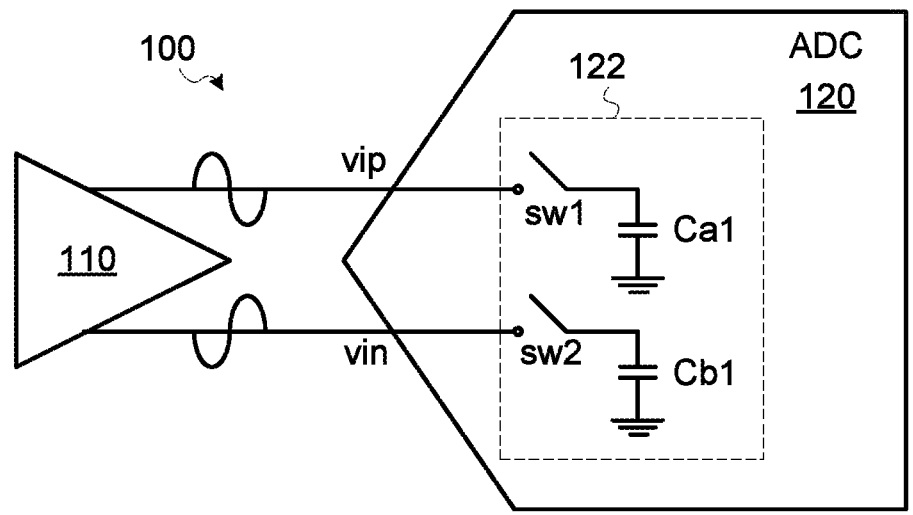
FIG. 1 (prior art) schematically illustrates a conventional analog-to-digital conversion system.
Figure 2A:
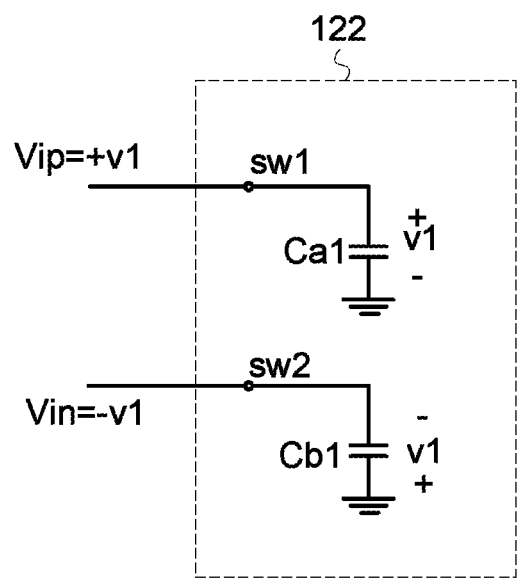
FIG. 2A (prior art) schematically illustrates the operations of the differential sampling circuit during a sampling cycle.
Figure 2B:
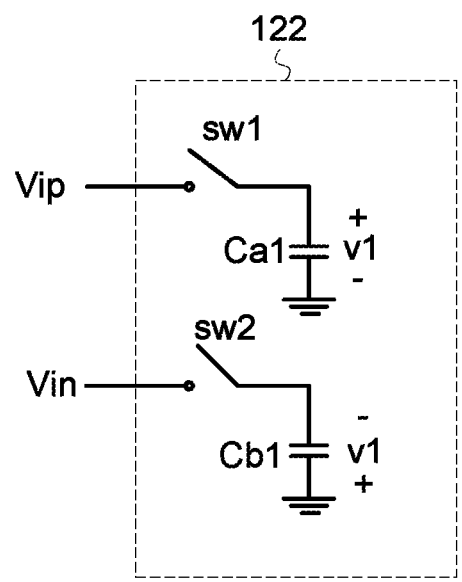
FIG. 2B (prior art) schematically illustrates the operations of the differential sampling circuit of FIG. 1 during a holding cycle.
Figure 3:
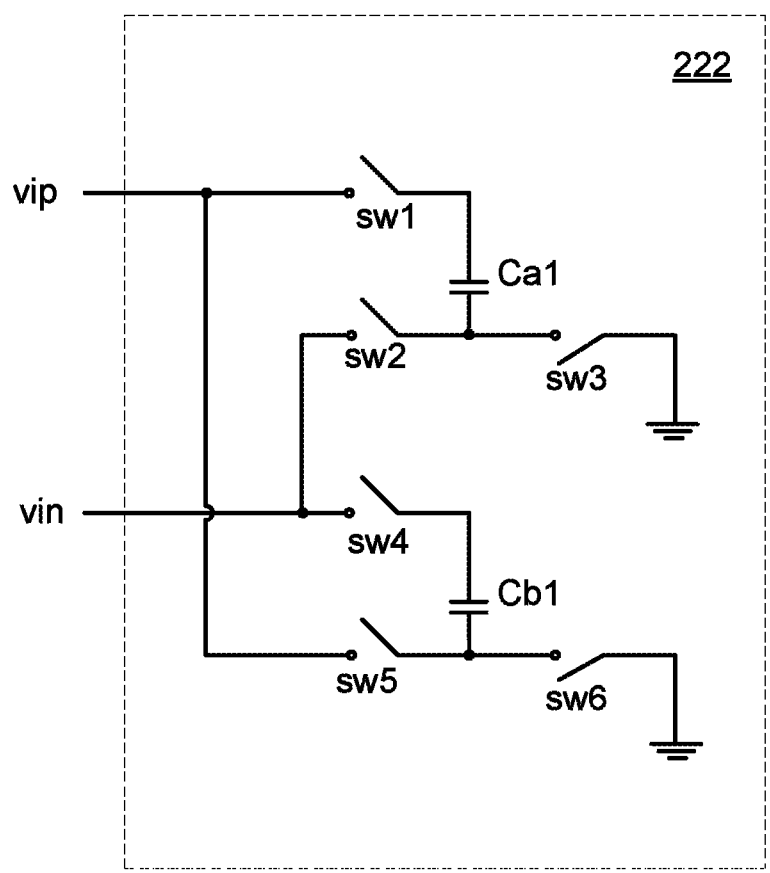
FIG. 3 schematically illustrates the circuitry of a differential sampling circuit according to an embodiment of the present invention.

FIG. 3 schematically illustrates the circuitry of a differential sampling circuit according to an embodiment of the present invention. As shown in FIG. 3, the differential sampling circuit 222 comprises switching elements sw1-sw6 and sampling capacitors Ca1, Cb1. The capacitance values of the sampling capacitors Ca1 and Cb1 are equal.

A first terminal of the switching element sw1 receives a first signal vip of a differential signal pair. A first terminal of the switching element sw2 receives a second signal vin of the differential signal pair. A first terminal of the sampling capacitor Ca1 is connected with a second terminal of the switching element sw1. A second terminal of the sampling capacitor Ca1 is connected with a second terminal of the switching element sw2. A first terminal of the switching element sw3 is connected with the second terminal of the switching element sw2. A second terminal of the switching element sw3 is connected with a ground terminal.

A first terminal of the switching element sw4 receives the second signal vin of the differential signal pair. A first terminal of the switching element sw5 receives the first signal vip of the differential signal pair. A first terminal of the sampling capacitor Cb1 is connected with a second terminal of the switching element sw4. A second terminal of the sampling capacitor Cb1 is connected with a second terminal of the switching element sw5. A first terminal of the switching element sw6 is connected with the second terminal of the switching element sw5. A second terminal of the switching element sw6 is connected with the ground terminal.

Figure 4A:
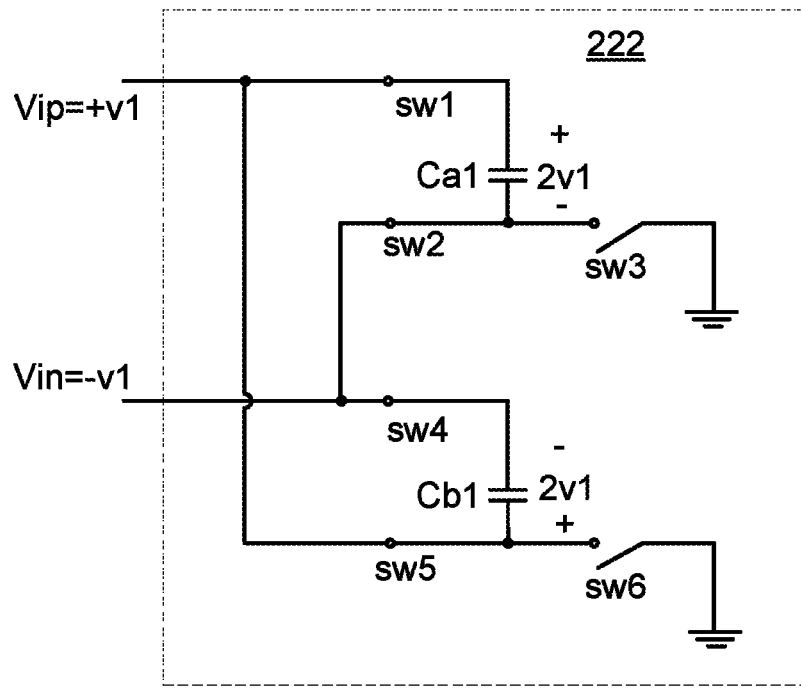
FIG. 4A schematically illustrates the operations of the differential sampling circuit of FIG. 3 during a sampling cycle.
Figure 4B:
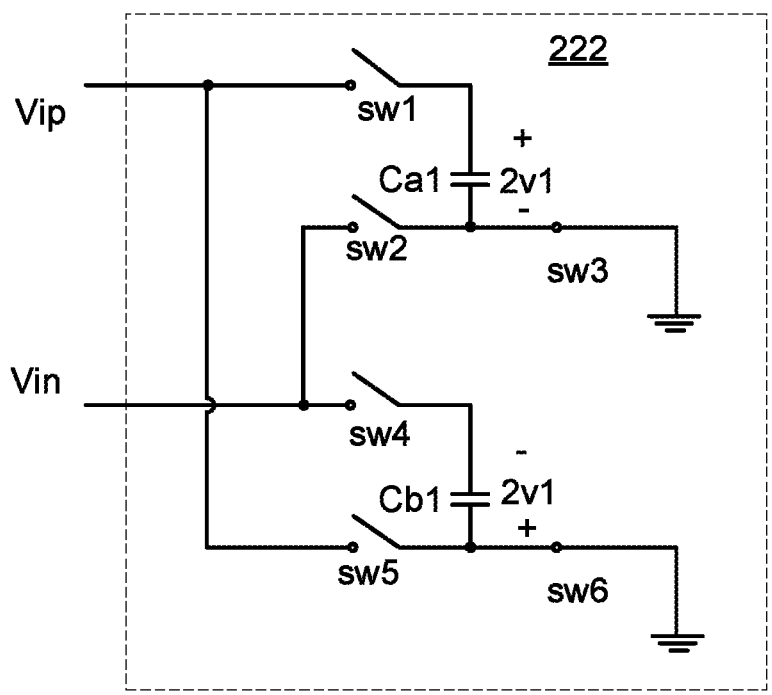
FIG. 4B schematically illustrates the operations of the differential sampling circuit of FIG. 3 during a holding cycle.

FIG. 4A schematically illustrates the operations of the differential sampling circuit of FIG. 3 during a sampling cycle. FIG. 4B schematically illustrates the operations of the differential sampling circuit of FIG. 3 during a holding cycle. The sampling cycle and the holding cycle are alternate cycles.

During the sampling cycle, the switching elements sw1, sw2, sw4 and sw5 are in a close state, but the switching elements sw3 and sw6 are in an open state. Consequently, the voltage 2v1 is stored in the sampling capacitor Ca1. The potential at the first terminal of the sampling capacitor Ca1 is higher than the potential at the second terminal of the sampling capacitor Ca1. Similarly, the voltage 2v1 is stored in the sampling capacitor Cb1. The potential at the second terminal of the sampling capacitor Cb1 is higher than the potential at the first terminal of the sampling capacitor Cb1.

During the holding cycle, the switching elements sw1, sw2, sw4 and sw5 are in the open state, but the switching elements sw3 and sw6 are in the close state. According to the stored voltages of the sampling capacitors Ca1 and Cb1, a processing circuit (not shown) acquires a difference voltage $\Delta v$. The difference voltage $\Delta v$ is 4v1, i.e., 2v1−(−2v1)=4v1.

The difference voltage $\Delta v$ obtained by the differential sampling circuit 222 of the present invention is 4v1. This difference voltage $\Delta v$ is two times the difference voltage of the conventional differential sampling circuit. When the differential sampling circuit 222 is applied to the analog-to-digital converter, the signal to noise ratio is improved since the signal is amplified and the noise of converter is keep the same.

In some embodiments, the differential sampling circuit 222 is further modified. Consequently, the difference voltage $\Delta v$ is adjustable.

Figure 5:
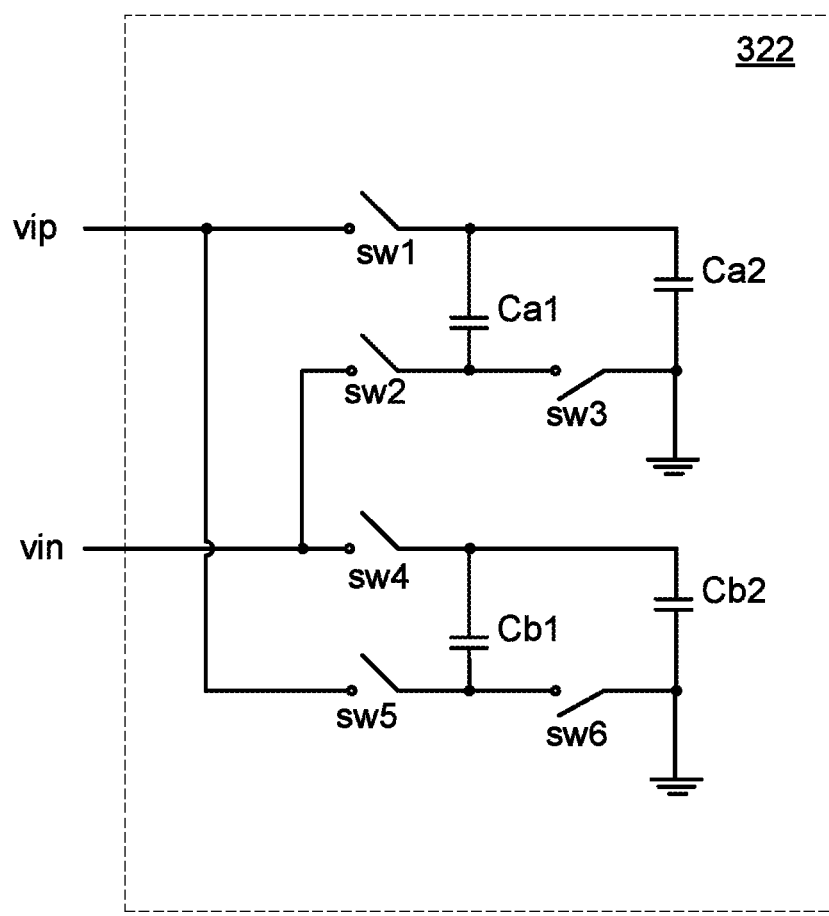
FIG. 5 schematically illustrates the circuitry of a differential sampling circuit according to another embodiment of the present invention.

FIG. 5 schematically illustrates the circuitry of a differential sampling circuit according to another embodiment of the present invention. As shown in FIG. 5, the differential sampling circuit 322 comprises switching elements sw1~sw6 and sampling capacitors Ca1, Ca2, Cb1 and Cb2. The capacitance values of the sampling capacitors Ca1 and Cb1 are equal. The capacitance values of the sampling capacitors Ca2 and Cb2 are equal.

A first terminal of the switching element sw1 receives a first signal vip of a differential signal pair. A first terminal of the switching element sw2 receives a second signal vin of the differential signal pair. A first terminal of the sampling capacitor Ca1 is connected with a second terminal of the switching element sw1. A second terminal of the sampling capacitor Ca1 is connected with a second terminal of the switching element sw2. A first terminal of the sampling capacitor Ca2 is connected with the second terminal of the switching element sw1. A second terminal of the sampling capacitor Ca2 is connected with a ground terminal. A first terminal of the switching element sw3 is connected with the second terminal of the switching element sw2. A second terminal of the switching element sw3 is connected with the ground terminal.

A first terminal of the switching element sw4 receives the second signal vin of the differential signal pair. A first terminal of the switching element sw5 receives the first signal vip of the differential signal pair. A first terminal of the sampling capacitor Cb1 is connected with a second terminal of the switching element sw4. A second terminal of the sampling capacitor Cb1 is connected with a second terminal of the switching element sw5. A first terminal of the sampling capacitor Cb2 is connected with the second terminal of the switching element sw4. A second terminal of the sampling capacitor Cb2 is connected with the ground terminal. A first terminal of the switching element sw6 is connected with the second terminal of the switching element sw5. A second terminal of the switching element sw6 is connected with the ground terminal.

Figure 6A:
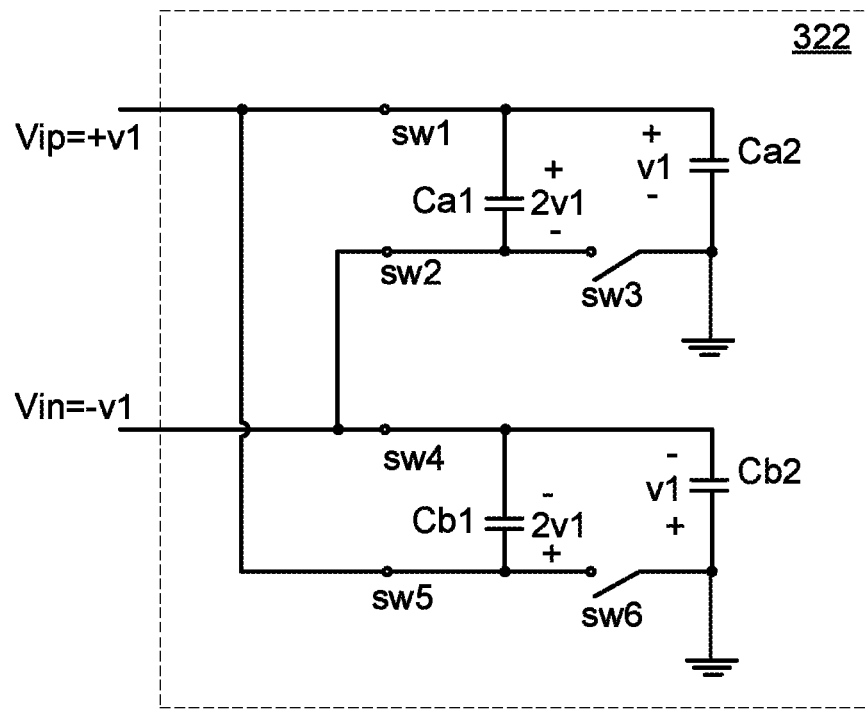
FIG. 6A schematically illustrates the operations of the differential sampling circuit of FIG. 5 during a sampling cycle.
Figure 6B:
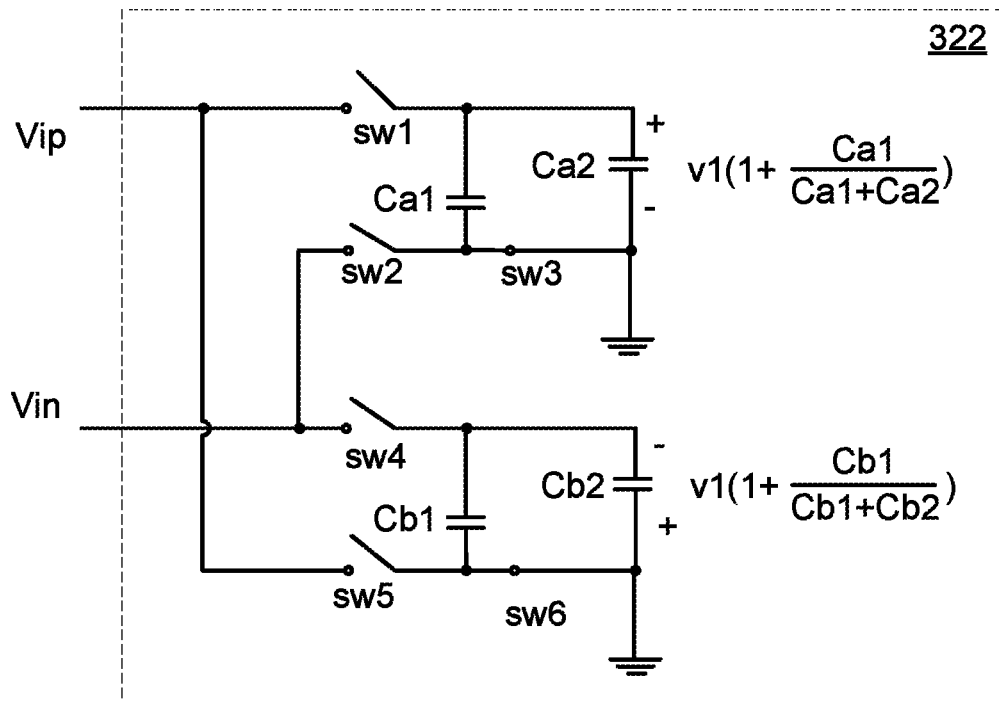
FIG. 6B schematically illustrates the operations of the differential sampling circuit of FIG. 5 during a holding cycle.

FIG. 6A schematically illustrates the operations of the differential sampling circuit of FIG. 5 during a sampling cycle. FIG. 6B schematically illustrates the operations of the differential sampling circuit of FIG. 5 during a holding cycle. The sampling cycle and the holding cycle are alternate cycles.

During the sampling cycle, the switching elements sw1, sw2, sw4 and sw5 are in a close state, but the switching elements sw3 and sw6 are in an open state. Consequently, the voltage 2v1 is stored in the sampling capacitor Ca1. The potential at the first terminal of the sampling capacitor Ca1 is higher than the potential at the second terminal of the sampling capacitor Ca1. The voltage v1 is stored in the sampling capacitor Ca2. The potential at the first terminal of the sampling capacitor Ca2 is higher than the potential at the second terminal of the sampling capacitor Ca2. Similarly, the voltage 2v1 is stored in the sampling capacitor Cb1. The potential at the second terminal of the sampling capacitor Cb1 is higher than the potential at the first terminal of the sampling capacitor Cb1. The voltage v1 is stored in the sampling capacitor Cb2. The potential at the second terminal of the sampling capacitor Cb2 is higher than the potential at the first terminal of the sampling capacitor Cb2.

During the holding cycle, the switching elements sw1, sw2, sw4 and sw5 are in the open state, but the switching elements sw3 and sw6 are in the close state. Since the sampling capacitors Ca1 and Ca2 are in parallel with each other, the stored voltage is changed to $$v1 \cdot \left(1 + \frac{Ca1}{Ca1 + Ca2}\right).$$

Similarly, since the sampling capacitors Cb1 and Cb2 are in parallel with each other, the stored voltage is changed to $$v1 \cdot \left(1 + \frac{Cb1}{Cb1 + Cb2}\right).$$

As mentioned above, the capacitance values of the sampling capacitors Ca1 and Cb1 are equal, and the capacitance values of the sampling capacitors Ca2 and Cb2 are equal. Consequently, the difference voltage Δv is equal to $$2v1 \cdot \left(1 + \frac{Ca1}{Ca1 + Ca2}\right).$$

In this embodiment, the ratio of the difference voltage Δv obtained by the differential sampling circuit 322 to the difference voltage Δv obtained by the conventional differential sampling circuit 122 is equal to $$\left(1 + \frac{Cb1}{Cb1 + Cb2}\right),$$

which is defined as an amplifying ratio of the sampled signal of the differential sampling circuit 322. By adjusting the capacitance values of the sampling capacitors Ca1 and Ca2, the amplifying ratio of the sampled signal is correspondingly changed.

When the differential sampling circuit 322 is applied to an analog-to-digital conversion system, the amplifying ratio of the sampled signal is adjustable according to the capacitance values of the sampling capacitors Ca1 and Ca2. In other words, the gain requirement of the buffering circuit can be reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A differential sampling circuit, comprising:
  a first switching element, wherein a first terminal of the first switching element receives a first signal of a differential signal pair;
  a second switching element, wherein a first terminal of the second switching element receives a second signal of the differential signal pair;
  a third switching element, wherein a first terminal of the third switching element is connected with a second terminal of the second switching element, and a second terminal of the third switching element is connected with a reference voltage terminal;
  a first sampling capacitor, wherein a first terminal of the first sampling capacitor is connected with a second terminal of the first switching element, and a second terminal of the first sampling capacitor is connected with the second terminal of the second switching element;
  a fourth switching element, wherein a first terminal of the fourth switching element receives the second signal of the differential signal pair;
  a fifth switching element, wherein a first terminal of the fifth switching element receives the first signal of the differential signal pair;
  a sixth switching element, wherein a first terminal of the sixth switching element is connected with a second terminal of the fifth switching element, and a second terminal of the sixth switching element is connected with the reference voltage terminal; and
  a second sampling capacitor, wherein a first terminal of the second sampling capacitor is connected with a second terminal of the fourth switching element, and a second terminal of the second sampling capacitor is connected with the second terminal of the fifth switching element;

wherein during a sampling cycle, the first switching element, the second switching element, the fourth switching element and the fifth switching element are in a close state, and the third switching element and sixth switching element are in an open state.

2. The differential sampling circuit as claimed in claim 1, wherein the reference voltage terminal is a ground terminal.

3. The differential sampling circuit as claimed in claim 1, wherein during a holding cycle, the first switching element, the second switching element, the fourth switching element and the fifth switching element are in the open state, and the third switching element and sixth switching element are in the close state.

4. The differential sampling circuit as claimed in claim 1, wherein a capacitance value of the first sampling capacitor and a capacitance value of the second sampling capacitor are equal.

5. A differential sampling circuit, comprising:
- a first switching element, wherein a first terminal of the first switching element receives a first signal of a differential signal pair;
- a second switching element, wherein a first terminal of the second switching element receives a second signal of the differential signal pair;
- a third switching element, wherein a first terminal of the third switching element is connected with a second terminal of the second switching element, and a second terminal of the third switching element is connected with a reference voltage terminal;
- a first sampling capacitor, wherein a first terminal of the first sampling capacitor is connected with a second terminal of the first switching element, and a second terminal of the first sampling capacitor is connected with the second terminal of the second switching element;
- a second sampling capacitor, wherein a first terminal of the second sampling capacitor is connected with the second terminal of the first switching element, and a second terminal of the second sampling capacitor is connected with the reference voltage terminal;
- a fourth switching element, wherein a first terminal of the fourth switching element receives the second signal of the differential signal pair;
- a fifth switching element, wherein a first terminal of the fifth switching element receives the first signal of the differential signal pair;
- a sixth switching element, wherein a first terminal of the sixth switching element is connected with a second terminal of the fifth switching element, and a second terminal of the sixth switching element is connected with the reference voltage terminal;
- a third sampling capacitor, wherein a first terminal of the third sampling capacitor is connected with a second terminal of the fourth switching element, and a second terminal of the third sampling capacitor is connected with the second terminal of the fifth switching element; and
- a fourth sampling capacitor, wherein a first terminal of the fourth sampling capacitor is connected with a second terminal of the fourth switching element, and a second terminal of the fourth sampling capacitor is connected with the reference voltage terminal.

6. The differential sampling circuit as claimed in claim 5, wherein the reference voltage terminal is a ground terminal.

7. The differential sampling circuit as claimed in claim 5, wherein during a sampling cycle, the first switching element, the second switching element, the fourth switching element and the fifth switching element are in a close state, and the third switching element and sixth switching element are in an open state.

8. The differential sampling circuit as claimed in claim 7, wherein during a holding cycle, the first switching element, the second switching element, the fourth switching element and the fifth switching element are in the open state, and the third switching element and sixth switching element are in the close state.

9. The differential sampling circuit as claimed in claim 5, wherein a capacitance value of the first sampling capacitor and a capacitance value of the third sampling capacitor are equal.

10. The differential sampling circuit as claimed in claim 9, wherein a capacitance value of the second sampling capacitor and a capacitance value of the fourth sampling capacitor are equal.

* * * * *